(12) United States Patent
Zhang et al.

(10) Patent No.: US 10,122,355 B2
(45) Date of Patent: Nov. 6, 2018

(54) HIGH-POWER ADJUSTABLE HIGH-FREQUENCY FRACTIONAL-ORDER CAPACITOR WITH ORDER GREATER THAN 1 AND CONTROL METHOD THEREOF

(71) Applicant: SOUTH CHINA UNIVERSITY OF TECHNOLOGY, Guangdong (CN)

(72) Inventors: Bo Zhang, Guangdong (CN); Yanwei Jiang, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 15/555,980

(22) PCT Filed: Dec. 17, 2016

(86) PCT No.: PCT/CN2016/110552
§ 371 (c)(1),
(2) Date: Sep. 6, 2017

(87) PCT Pub. No.: WO2018/023919
PCT Pub. Date: Feb. 8, 2018

(65) Prior Publication Data
US 2018/0269861 A1 Sep. 20, 2018

(30) Foreign Application Priority Data
Jul. 31, 2016 (CN) .......................... 2016 1 0630253

(51) Int. Cl.
*H03K 3/00* (2006.01)
*H03B 1/00* (2006.01)
(Continued)

(52) U.S. Cl.
CPC .............. *H03K 7/08* (2013.01); *H02M 7/537* (2013.01)

(58) Field of Classification Search
CPC .... H01G 4/005; H01G 4/206; H03H 17/0248; H03H 17/0213; H03K 7/08; H02M 7/537
(Continued)

(56) References Cited

U.S. PATENT DOCUMENTS

| 3,638,007 A * | 1/1972 | Brooks .............. G05B 23/0202 |
| | | 324/605 |
| 2003/0015938 A1* | 1/2003 | Battaglin ................. H03K 4/94 |
| | | 310/318 |

(Continued)

FOREIGN PATENT DOCUMENTS

| CN | 105099655 | 11/2015 |
| CN | 105790724 | 7/2016 |

OTHER PUBLICATIONS

Liu et al., "Dynamical Modeling and Numerical Analysis for Fractional-Order Power Capacitor System," Journal of Xi'an Jiaotong University, Aug. 2014, pp. 104-108.
(Continued)

Primary Examiner — Thomas Skibinski
(74) Attorney, Agent, or Firm — JCIPRNET

(57) ABSTRACT

The present invention provides a high-power adjustable high-frequency fractional order capacitor with an order greater than 1, and a control method thereof. The fractional-order capacitor comprises an alternating current input module, a coupling impedance, a high-frequency alternating current controlled voltage source, a controller and an alternating current input sampling module. The controller generates a corresponding control signal according to an input voltage signal and an input current signal which are acquired by the alternating current input sampling module, and controls an output voltage of the controlled power source, such
(Continued)

that an input current and an input voltage satisfy a current-voltage relationship of the fractional-order capacitor. The obtained relationship between the input current and the input voltage is consistent with the definition of the fractional-order capacitor with the order greater than 1.

7 Claims, 7 Drawing Sheets

(51) Int. Cl.
  *H03K 7/08* (2006.01)
  *H02M 7/537* (2006.01)

(58) Field of Classification Search
  USPC ............... 327/108–112, 427, 434, 437, 290; 326/82, 83, 87
  See application file for complete search history.

(56) References Cited

U.S. PATENT DOCUMENTS

| | | | |
|---|---|---|---|
| 2006/0267595 A1* | 11/2006 | Bohannan | B82Y 10/00 324/600 |
| 2010/0264996 A1* | 10/2010 | Chang | H03B 27/00 331/137 |
| 2011/0270903 A1* | 11/2011 | Hinson | H03H 17/04 708/235 |
| 2014/0266374 A1* | 9/2014 | Almadhoun | H01G 4/005 327/290 |
| 2017/0163246 A1* | 6/2017 | Smigelski | H03H 17/00 |

OTHER PUBLICATIONS

Krishna et al., "Fabrication of a Fractional Order Capacitor With Desired Specifications: A Study on Process Identification and Characterization," IEEE Transactions on Electron Devices, Nov. 2011, pp. 4067-4073.

* cited by examiner

HIGH-POWER ADJUSTABLE HIGH-FREQUENCY FRACTIONAL-ORDER CAPACITOR WITH ORDER GREATER THAN 1 AND CONTROL METHOD THEREOF

CROSS-REFERENCE TO RELATED APPLICATION

This application is a 371 application of International PCT application serial no. PCT/CN2016/110552, filed on Dec. 17, 2016, which claims the priority benefit of Chinese application no. 201610630253.6, filed on Jul. 31, 2016. The entirety of each of the abovementioned patent applications is hereby incorporated by reference herein and made a part of this specification.

TECHNICAL FIELD

The present invention relates to the technical field of construction of fractional-order devices, and in particular, relates to a high-power adjustable high-frequency fractional-order capacitor with an order greater than 1, and a control method thereof.

BACKGROUND

Fractional-order calculus has a history of over 300 years, which promotes the order of the calculus from an integer order to a fraction or a complex number. The fractional-order calculus may reflect some phenomena in the nature more authentically. In fact, an integer-order capacitor does not essentially exist, which is an element with fractional-order properties. However, most of the capacitors currently used in practice have an order close to 1, and thus the fractional order may be neglected. However, if the fractional-order properties of the capacitors may be utilized to purposely design fractional-order capacitors with different orders, capacitances and powers, a new application field of the capacitors may be opened up. In 1964, G. E Carlson, a scholar from the United States, initially proposed the concept "fractional-order capacitor" according to the definition of the fractional-order calculus, and developed a passive circuit equivalent model of a fractional-order capacitor with a specific order according to the Newton iteration method. Since then, a lot of scholars in China and abroad proposed a plurality of solutions of constructing the fractional-order capacitors by using traditional resistors, capacitors, inductors, operational amplifiers and the like. However, these solutions are only applicable to milliwat-level power, which severely restricts application of the fractional-order capacitor in various power scenarios. Also, some scholars proposed manufacturing the fractional-order capacitors based on the concept of fractal geometry and by the silicon process, which, however, may be achieved only within a specific range where the order of the capacitor is less than 1.

SUMMARY OF THE INVENTION

Directing at disadvantages and defects in the prior art, the present invention provides a high-power adjustable high-frequency fractional order capacitor with an order greater than 1 and a control method thereof. To be specific, a fundamental wave voltage output by a high-frequency controlled voltage source is controlled using a control signal generated by a controller, such that an input current and an input voltage satisfy the definition of the fractional-order capacitor. By configuring the controller, fractional-order capacitors with different capacitances and orders may be achieved. The high-frequency controlled voltage source is formed of a high-frequency alternating current inverter circuit capable of outputting a high-frequency alternating current voltage, and has the advantages of operation flexibility and online-adjustable capacitance and order. In addition, a power of the fractional-order capacitor is determined by the high-frequency alternating current inverter circuit. Therefore, the present invention is capable of achieving fractional-order capacitors with different power levels.

The objectives of the present invention are achieved by employing following technical solutions.

A high-power adjustable high-frequency fractional-order capacitor with an order greater than 1 comprises an alternating current input module, a coupling impedance, a high-frequency alternating current controlled voltage source, an alternating current input sampling module and a controller. An end of the alternating current input module is connected to an end of the coupling impedance, the other end of the coupling impedance is connected to a positive output end of the high-frequency alternating current controlled voltage source, and a negative output end of the high-frequency alternating current controlled voltage source is connected to the other end of the alternating current input module. The alternating current sampling module samples an input current $I_{in}$ and an input voltage $V_{in}$ to obtain an amplitude $I_{inm}$ and a phase $\varphi_i$ of the input current $I_{in}$ as well as an amplitude $V_{inm}$ and a phase $\varphi_v$ of the input voltage $V_{in}$, and feeds the amplitudes and phases into the controller. The controller processes the sampled signals based on a fractional-order capacitor current closed-loop control algorithm, and generates a control signal D to send to the high-frequency alternating current controlled voltage source. The high-frequency alternating current controlled voltage source generates a fundamental wave voltage $V_F$ between the positive output end and the negative output end according to the control signal D.

In the above-described fractional-order capacitor, it may be known from the Kirchhoff's Law that:

$$i_{in}(t) = \frac{v_{in}(t) - v_F(t)}{jwL_f}.$$

As seen from the above formula, when the input voltage $V_{in}$ is known, controlling the controlled voltage source to output the fundamental wave voltage $V_F$, may make the input current $I_{in}$ have any waveform. Therefore, correctly controlling output of the fundamental wave voltage $V_F$ may cause the relationship between the input current $I_{in}$ and the input voltage $V_{in}$ to satisfy the definition of the fractional-order capacitor at a desired frequency.

The high-frequency controlled voltage source according to the present invention is formed of a high-frequency alternating current inverter circuit which may output a high-frequency alternating current voltage, may output an active power outward, and satisfies the feature of the fractional-order capacitor when the order is greater than 1. The basic working principles of the high-frequency alternating current inverter circuit are as follows: the control signal D is converted into a pulse width modulated signal, to drive a switch tube of the circuit so as to control the output fundamental wave voltage $V_F$ of the circuit, and to control the relationship between the input current $I_{in}$ and the input voltage $V_{in}$ at the desired frequency to satisfy a current-voltage relationship of the fractional-order capacitor.

Further, the high-frequency alternating current controlled voltage source is formed of the high-frequency alternating current inverter circuit capable of outputting the high-frequency alternating current voltage. The high-frequency alternating current controlled voltage source outputs the active power outward such that the order greater than 1 is achieved, and fractional-order capacitors with different power levels are achieved by using controlled voltage sources with different power capacities.

Further, the controller is formed of a digital signal processor.

Further, the fractional-order capacitor current closed-loop control algorithm is a current closed-loop control algorithm based on a phasor analysis, which prevents detecting voltage and current waveforms point by point within a high-frequency alternating current cycle, reduces load of the controller and is easy to achieve digitally.

Further, the fractional-order capacitor current closed-loop control algorithm is achieved when running on a digital signal processor, and online adjustments of a capacitance and the order of the fractional-order capacitor are achieved by online modifying a software parameter.

Further, the order is α, whose value range is as follows:

$$\alpha > 1 \text{ and } \alpha \in (4k+1, 4l+2)$$

wherein k is an integer.

The fractional-order capacitor current closed-loop control algorithm is a control method based on "phasor analysis", which prevents detecting voltage and current waveforms point by point within a high-frequency alternating current cycle, reduces load of the controller and is easy to achieved digitally.

A control method for the high-power adjustable high-frequency fractional-order capacitor with the order greater than 1 specifically comprises:

assuming that an input voltage $V_{in}$, an input current $I_{in}$, and an output voltage $V_F$ of a high-frequency controlled source are all pure sinusoidal within an alternating current cycle and are co-frequency sinusoidal quantities. Because, in a stable state, when the high-frequency alternating current fractional-order capacitor operates, the voltage $V_{in}$ applied between two ends are sinusoidal, and the output voltage $V_F$ of the high-frequency controlled source is also sinusoidal and controllable at the same frequency as $V_{in}$. Therefore, this assumption is reasonable.

When $V_F$, $V_{in}$ and $I_{in}$ are all sinusoidal, waveforms thereof are only depicted by frequency, amplitude and initial phase, and the waveforms are represented by the "phasor analysis". A complex plane is constructed using a direction of $V_{in}$ as a real axis, and 90 degrees leading the direction of $V_{in}$ as an imaginary axis, and then phasor forms and an expression on the complex plane of $V_F$, $V_{in}$ and $I_{in}$ are as follows:

$$\dot{V}_F = V_{Fm} \angle (\varphi_F) = V_{F\_REAL} + jV_{F\_IMA}$$

$$\dot{V}_{in} = V_{inm} \angle (0) = V_{inm}$$

$$\dot{I}_{in} = I_{in} \angle (\varphi_i) = I_{in\_REAL} + jI_{in\_IMA}$$

wherein $\varphi_F$ and $\varphi_i$; are angle values of the output voltage of the controlled voltage source and the input voltage leading the input current, respectively. $V_{Fm}$ is an amplitude of the output voltage of the controlled source, respectively. $V_{F\_REAL}$ and $V_{F\_IMA}$ are a real portion and an imaginary portion of $\dot{V}_F$, respectively. $I_{in\_REAL}$ and $I_{in\_IMA}$ are a real portion and an imaginary portion of $\dot{I}_{in}$, respectively.

After a controller converts the input voltage of the alternating current input sampling module into a phasor expression, performing the following operation:

$$\begin{aligned}
\dot{I}_{ref} &= (jw)^\alpha C_a \dot{V}_{in} = w^\alpha C_a V_{inm} j^\alpha \\
&= w^\alpha C_a V_{inm} \cos\left(\frac{\pi}{2}\alpha\right) + jw^\alpha C_a V_{inm} \sin\left(\frac{\pi}{2}\alpha\right) \\
&= I_{ref\_REAL} + jI_{ref\_IMA}
\end{aligned}$$

wherein $\dot{I}_{ref}$ is a phasor expression of a current given signal $I_{ref}(t)$ in the fractional-order capacitor current closed-loop control algorithm, $I_{ref\_REAL}$ and $I_{ref\_IMA}$ are a real portion and an imaginary portion, respectively, $C_\alpha$ is a capacitance of the fractional-order capacitor, α is the order of the fractional-order capacitor, and as seen from the above formula, a relationship between the current given signal $I_{ref}$ and the input voltage $V_{in}$ is a current-voltage relationship of the fractional-order capacitor.

Comparing the current given signal $\dot{I}_{ref}$ with the input current $\dot{I}_{in}$, a difference is obtained, and a voltage $\dot{V}_F$ to be output by the high-frequency alternating current controlled voltage source is obtained from the obtained difference by the current closed-loop control algorithm, and converted into the control signal D to regulate the input current $\dot{I}_{in}$, such that the input current $\dot{I}_{in}$ traces the current given signal $\dot{I}_{ref}$, that is, such that the relationship between the input current and the input voltage is the current-voltage relationship of the fractional-order capacitor.

As compared with the prior art, the present invention has the following advantages and technical effects: The high-power adjustable high-frequency fractional-order capacitor with the order greater than 1 provided in the present invention is capable of operating when the input voltage, that is, the fractional-order capacitor voltage is at a high frequency, and the obtained relationship between the input current and the input voltage is consistent with the definition of the fractional-order capacitor with the order greater than 1. Further, the order and a capacitance of different fractional-order capacitors may be flexibly adjusted and achieved by adjusting the parameters of the controller according to the needs of the application scenario. In addition, the power of the fractional-order capacitor achieved in the present invention is determined by the controlled voltage source. Therefore, controlled voltage sources with different power levels may be selected and used to accommodate different power application scenarios.

DETAILED DESCRIPTION OF THE PREFERRED EMBODIMENT

For further illustration of the content and characteristics of the present invention, the present invention is described in detail below with reference to the accompanying drawings and specific embodiments, which however are not intended to limit the implementation and scope of protection of the present invention.

A high-power adjustable high-frequency fractional-order capacitor with an order greater than 1 according to the present embodiment operates by observing the following basic principles: an output voltage of a high-frequency alternating current controlled voltage source is controlled using a control signal generated by a controller, such that the relationship between an input current and an input voltage of the circuit satisfies the definition of the fractional-order capacitor with the order greater than 1, and the entire circuit is equivalent to a fractional-order capacitor.

Figure 1:
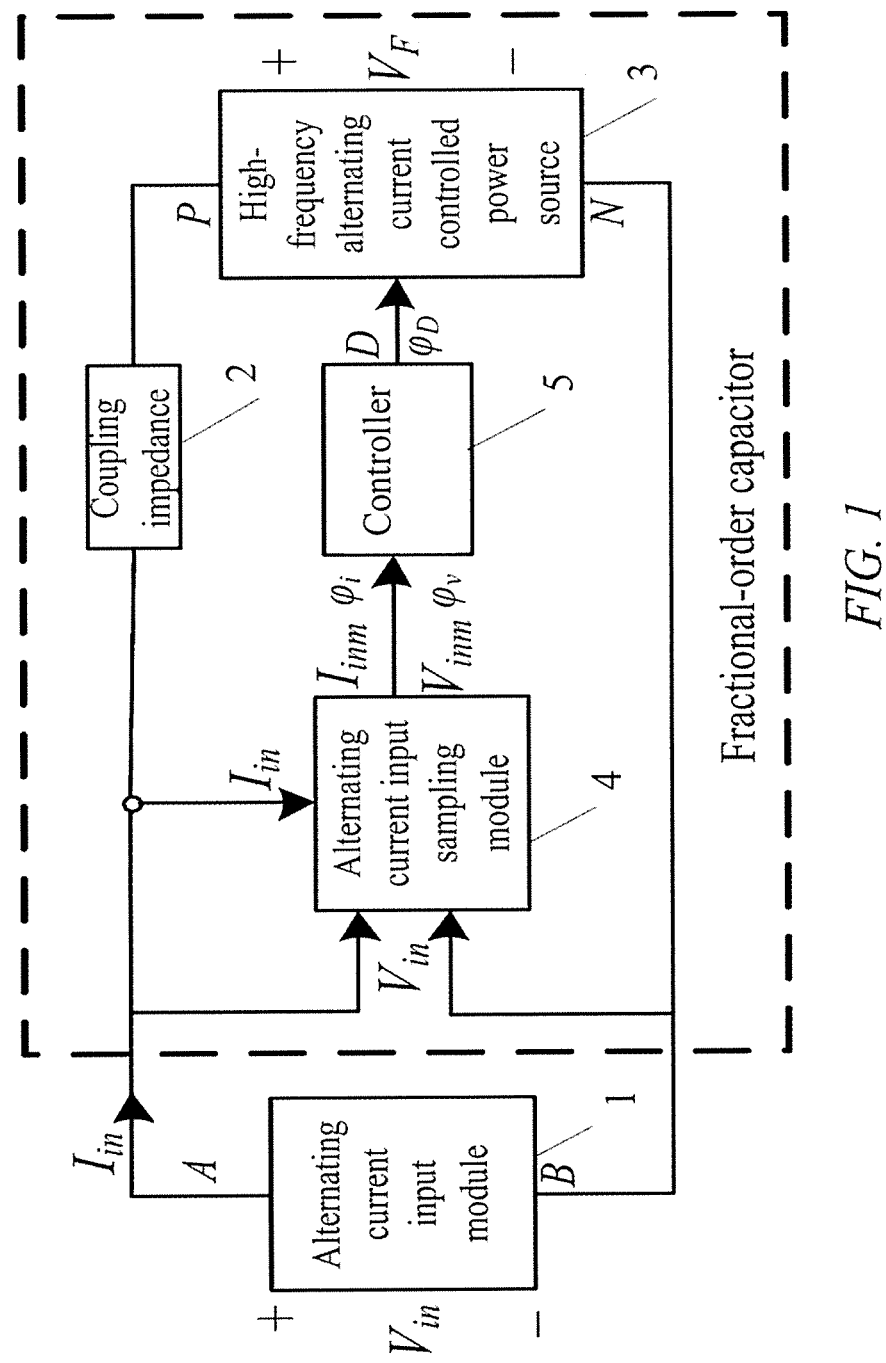
FIG. 1 is a model of a fractional-order capacitor with an order greater than 1 according to an implementation.

Referring to FIG. 1, a high-power adjustable fractional-order capacitor with an order greater than 1 comprises an alternating current input module 1, a coupling impedance 2, a high-frequency alternating current controlled voltage source 3, an alternating current input sampling module 4 and a controller 5. An end A of the alternating current input module 1 is connected to an end of the coupling impedance 2, the other end of the coupling impedance 2 is connected to a positive output end P of the high-frequency alternating current controlled voltage source 3, and a negative output end N of the high-frequency alternating current controlled voltage source 3 is connected to the other end B of the alternating current input module 1. The alternating current sampling module 4 samples an input current $I_{in}$ and an input voltage $V_{in}$ to obtain an amplitude $I_{inm}$ and a phase $\varphi_i$ of the input current $I_{in}$ as well as an amplitude $V_{inm}$ and a phase $\varphi_v$ of the input voltage $V_{in}$ and feeds the amplitudes and phases to the controller 5, i.e., a digital signal processor TMS320F28335. The digital signal processor processes the sampled signals based on a fractional-order capacitor current closed-loop control algorithm, and generates a control signal D to send to the high-frequency alternating current controlled voltage source 3. The high-frequency alternating current controlled voltage source 3 generates a fundamental wave voltage $V_F$ between the positive output end P and the negative output end N according to the control signal D.

Figure 2:
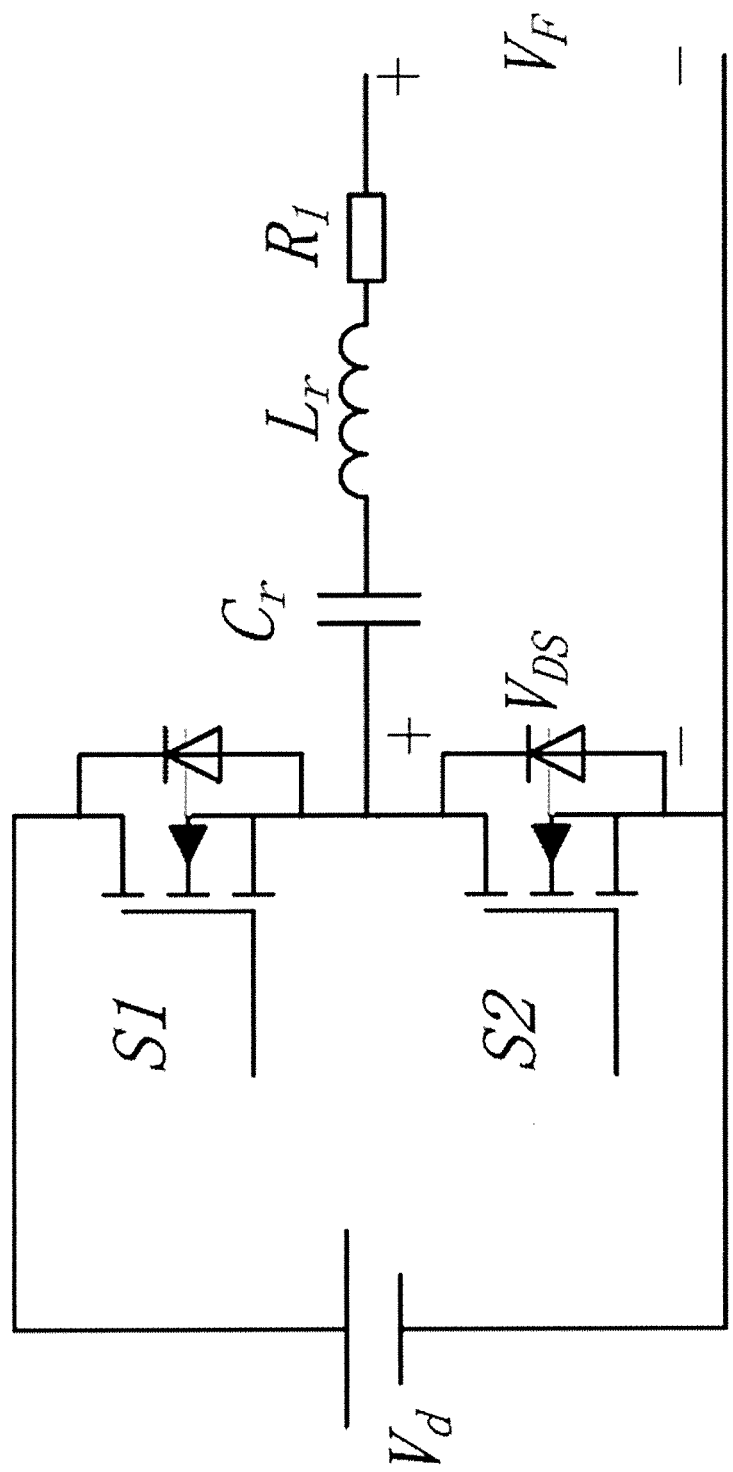
FIG. 2 is a circuit diagram of a D-class resonant inverter according to an implementation.

As illustrated in FIG. 1, the high-frequency controlled voltage source 3 employs a high-frequency alternating current inverter circuit capable of outputting a high-frequency alternating current voltage. In the present embodiment, the high-frequency alternating current inverter circuit employs a D-class resonant inverter, as illustrated in FIG. 2. In particular, $C_r$ and $L_r$ are resonant branches connected in series, R1 is an internal resistance of the resonant branches connected in series, and two switch tubes are complementary and conducted. A driving waveform duty cycle of the upper tube S1 is set as D and a phase difference with $V_{in}$ is $\varphi_D$, then the waveform of the voltage $V_{DS}$ between two ends of S2 has the same phase as the driving waveform of S1, and an amplitude is a square wave of a voltage $V_d$ at the direct current side. An expression formula of an instantaneous value may be obtained by performing Fourier decomposition for $V_{DS}$:

$$v_{DS}(t) = DV_d + \sum_{n=1}^{\infty} \frac{2V_d}{n\pi} \sin(nD\pi)\sin(nwt - \varphi_D) \quad (1)$$

In the above formula, w is a switch angle frequency of the high-frequency alternating current inverter circuit, that is, an operating frequency of the fractional-order capacitor, and n indicates that the current component is the $n^{th}$ harmonic.

After $V_{DS}$ is connected in series to $L_r$ and $C_r$ and subjected to resonance frequency selection, an expression formula of an instantaneous value of the output fundamental wave $V_F$ is:

$$v_F(t) = \frac{2V_d}{\pi} \sin(D\pi)\sin(wt - \varphi_F) \quad (2)$$

Within the duty cycle D∈[0,0.5], the amplitude of the fundamental wave $V_F$ and the duty cycle are in a one-to-one corresponding relationship, and the phase $\varphi_F$ of the fundamental wave $V_F$ is the same as the phase $\varphi_D$ of the driving waveform. Therefore, the amplitude and phase of the fundamental wave $V_F$ may be controlled by controlling the duty cycle and phase of the driving waveform of S1.

The digital signal processor converts the sampled voltage and current signals into phasor forms, and constructs a complex plane using a direction of $V_{in}$ as a real axis, and 90 degrees leading the direction of $V_{in}$ as an imaginary axis. Then the following phasor forms and an expression on the complex plane of $V_F$, $V_{in}$ and $I_{in}$ are obtained:

$$\dot{V}_{in} = V_{inm}\angle(0) = V_{inm} \quad (3)$$

$$\dot{I}_{in} = I_{inm}\angle(\varphi_i) = I_{in\_REAL} + jI_{in\_IMA} \quad (4)$$

In the above formulas, $\varphi_i$ is a phase difference between the input current $I_{in}$ and the input voltage $V_{in}$, and $I_{in\_REAL}$ and $I_{in\_IMA}$ are a real portion and an imaginary portion of input current vector $\dot{I}_{in}$, respectively.

$$I_{in\_REAL} = I_{inm}\cos(\varphi_i) \quad (5)$$

$$I_{in\_IMA} = I_{inm}\sin(\varphi_i) \quad (6)$$

In the meantime, the digital signal processor performs the following operation for the phasor of the input voltage to obtain the current given signal $\dot{I}_{ref}$:

$$\dot{I}_{ref} = (jw)^\alpha C_\alpha \dot{V}_{in} = w^\alpha C_\alpha V_{inm} j^\alpha \quad (7)$$
$$= w^\alpha C_\alpha V_{inm} \cos\left(\frac{\pi}{2}\alpha\right) + jw^\alpha C_\alpha V_{inm} \sin\left(\frac{\pi}{2}\alpha\right)$$
$$= I_{ref\_REAL} + jI_{ref\_IMA}$$

In the above formula, $C_\alpha$ and $\alpha$ are the capacitance and the order of the fractional-order capacitor, respectively, and $I_{ref\_REAL}$ and $I_{ref\_IMA}$ are a real portion and an imaginary portion of the current given signal $\dot{I}_{ref}$, respectively.

The current given signal $\dot{I}_{ref}$ is compared with the input current $\dot{I}_{in}$ to obtain a difference, and an input voltage $\dot{V}_F$ desired to be output by the high-frequency alternating current controlled voltage source is obtained from the obtained difference by the current closed-loop control algorithm. The current closed-loop control algorithm used in this implementation is proportion control with input voltage feedforward compensation, that is:

$$\dot{V}_F = \dot{V}_{in} - (\dot{I}_{ref} - \dot{I}_{in})G_C \quad (8)$$
$$= V_{in} - (I_{ref\_REAL} + jI_{ref\_IMA} - I_{in\_REAL} - jI_{in\_IMA})G_C$$
$$= V_{in} - \left(w^\alpha C_\alpha V_{inm}\cos\left(\frac{\pi}{2}\alpha\right) - I_{in\_REAL}\right)G_C -$$
$$j\left(w^\alpha C_\alpha V_{inm}\sin\left(\frac{\pi}{2}\alpha\right) - I_{in\_IMA}\right)G_C$$
$$= V_{F\_REAL} + jV_{F\_IMA}$$

In the above formula, $G_c$ is a proportion coefficient, and $V_{F\_REAL}$ and $V_{F\_IMA}$ are a real component and an imaginary component of the vector $\dot{V}_F$, respectively.

Then the amplitude $V_{Fm}$, and the phase $\varphi_F$ of $\dot{V}_F$ are respectively:

$$V_{Fm} = \sqrt{V_{F\_REAL}^2 + V_{F\_IMA}^2} \quad (9)$$

$$\varphi_F = \arcsin\left(\frac{V_{F\_IMA}}{V_{Fm}}\right) \quad (10)$$

Therefore, the amplitude and phase of $\dot{V}_F$ may be obtained by sampling in real time the phase difference between $V_{in}$ and $I_{in}$ and amplitudes thereof and by the operations in formulas (3)-(10). In this way, there is no need to sample the current and voltage waveforms point by point within an alternating current cycle.

As obtained from formula (2), the duty cycle of the drive corresponding to $\dot{V}_F$ is:

$$D = \frac{\arcsin\left(\frac{V_{Fm}\pi}{2V_d}\right)}{\pi} \quad (11)$$

The driving phase is equal to the phase of $\dot{V}_F$:

$$\varphi_D = \varphi_F = \arcsin\left(\frac{V_{F\_IMA}}{V_{Fm}}\right) \quad (12)$$

Figure 3:
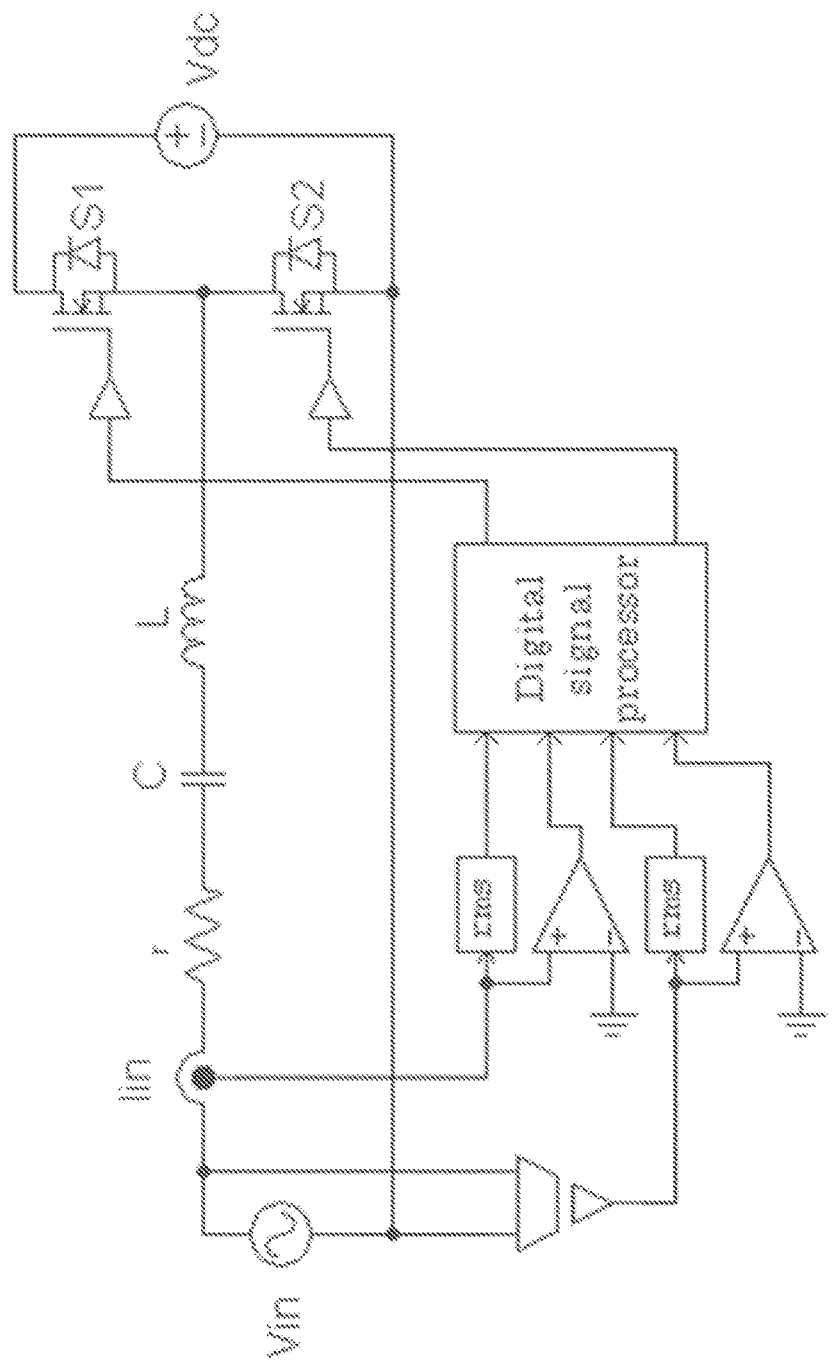
FIG. 3 is a simulation principle diagram of a fractional-order capacitor according to an implementation.

FIG. 3 is a simulation principle diagram of a fractional-order capacitor with an order greater than 1 in a PSIM environment, wherein an inductance L comprises an inductance $L_r$ and a coupling inductance $L_f$ of resonant branches connected in series, and the current closed-loop control algorithm of the fractional-order capacitor is executed in the digital signal processor, including formulas (3)-(12). The online adjustments of the capacitance and the order of the fractional-order capacitor may be achieved by online modifying $C_\alpha$ and $\alpha$ in formula (7) in the digital signal processor.

An input alternating current voltage is set as 100 V/30 kHz, a voltage of the direct current power supply is 300 V, an inductor L is 1085 µH, a capacitance C is 26.08 nF, and an internal resistance r is 0.8 ohm.

Figure 4:
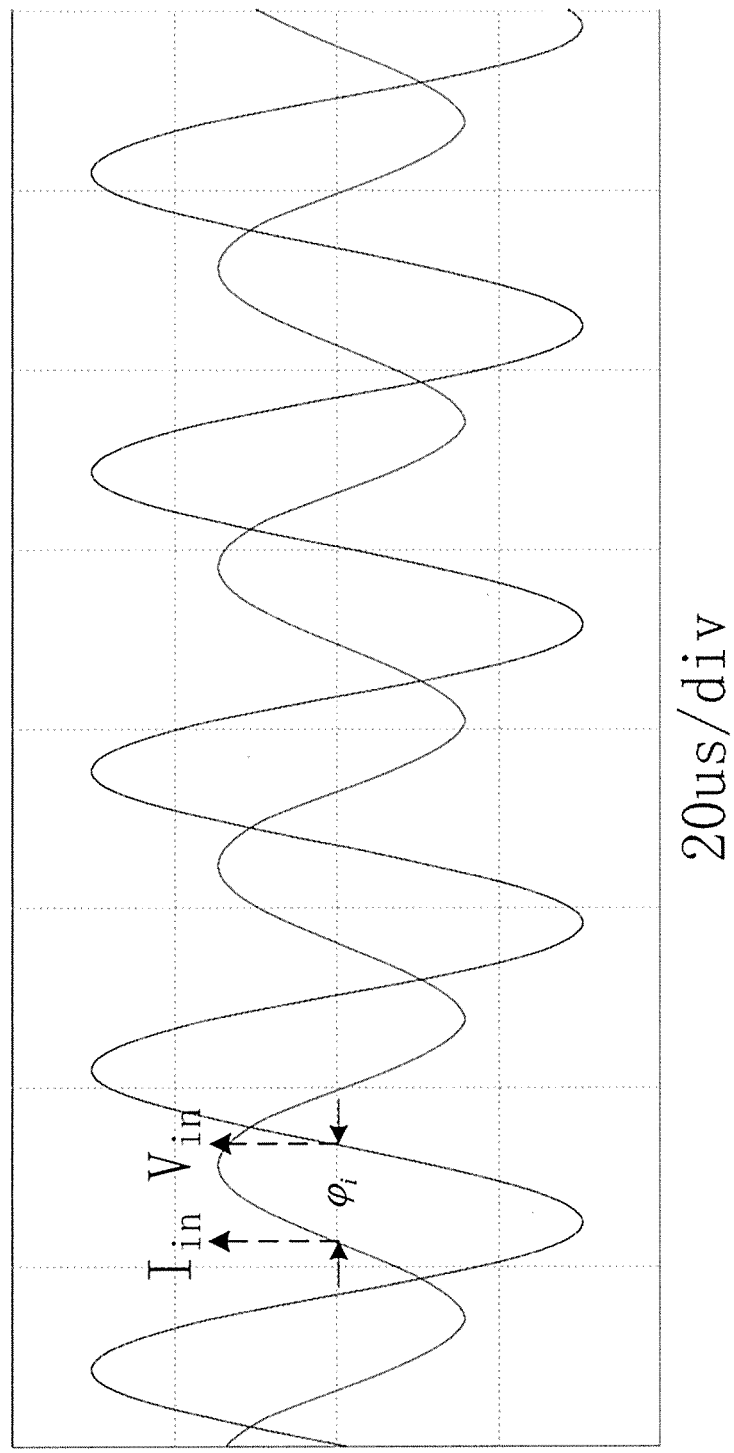
FIG. 4 is a simulation waveform diagram of an input voltage and an input current of a 1.3-order fractional-order capacitor according to an implementation.

When the simulated fractional-order capacitor satisfies $C_\alpha = 7 \times 10^{-9}$, $\alpha = 1.3$ and f=30 kHz, the waveforms of the input current and input voltage of the simulated model are as illustrated in FIG. 4. In this case, the phase difference between the input current and the input voltage satisfies $$\varphi_i = 1.3 \times \frac{\pi}{2},$$

and the relationship therebetween is absolutely consistent with the definition of the fraction-order capacitor.

Figure 5:
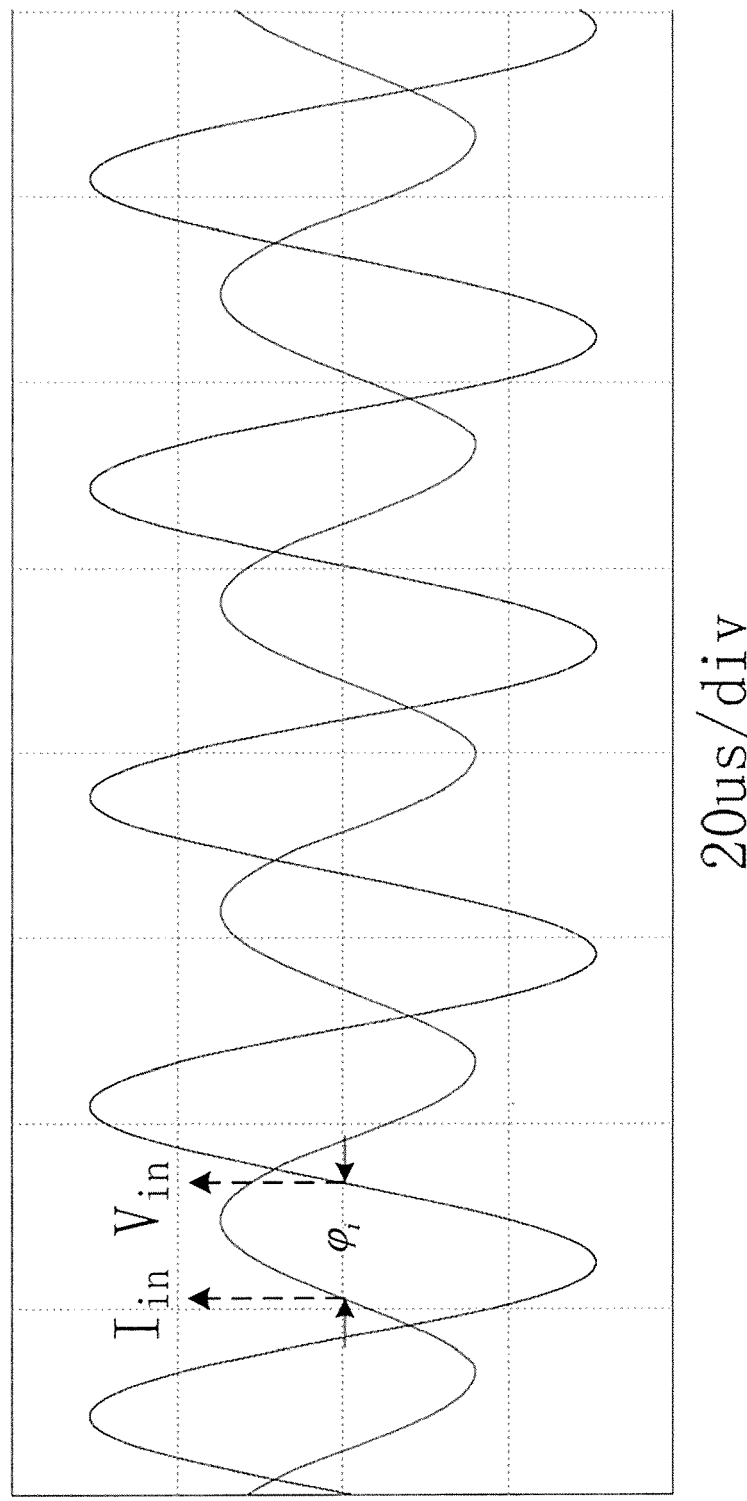
FIG. 5 is a simulation waveform diagram of an input voltage and an input current of a 1.5-order fractional-order capacitor according to an implementation.

When the simulated fractional-order capacitor satisfies $C_\alpha = 6 \times 10^{-10}$, $\alpha = 1.5$ and f=30 kHz, the waveforms of the input current and input voltage of the simulated model are as illustrated in FIG. 5. In this case, the phase difference between the input current and the input voltage satisfies $$\varphi_i = 1.5 \times \frac{\pi}{2},$$

and the relationship therebetween is absolutely consistent with the definition of the fraction-order capacitor.

Figure 6:
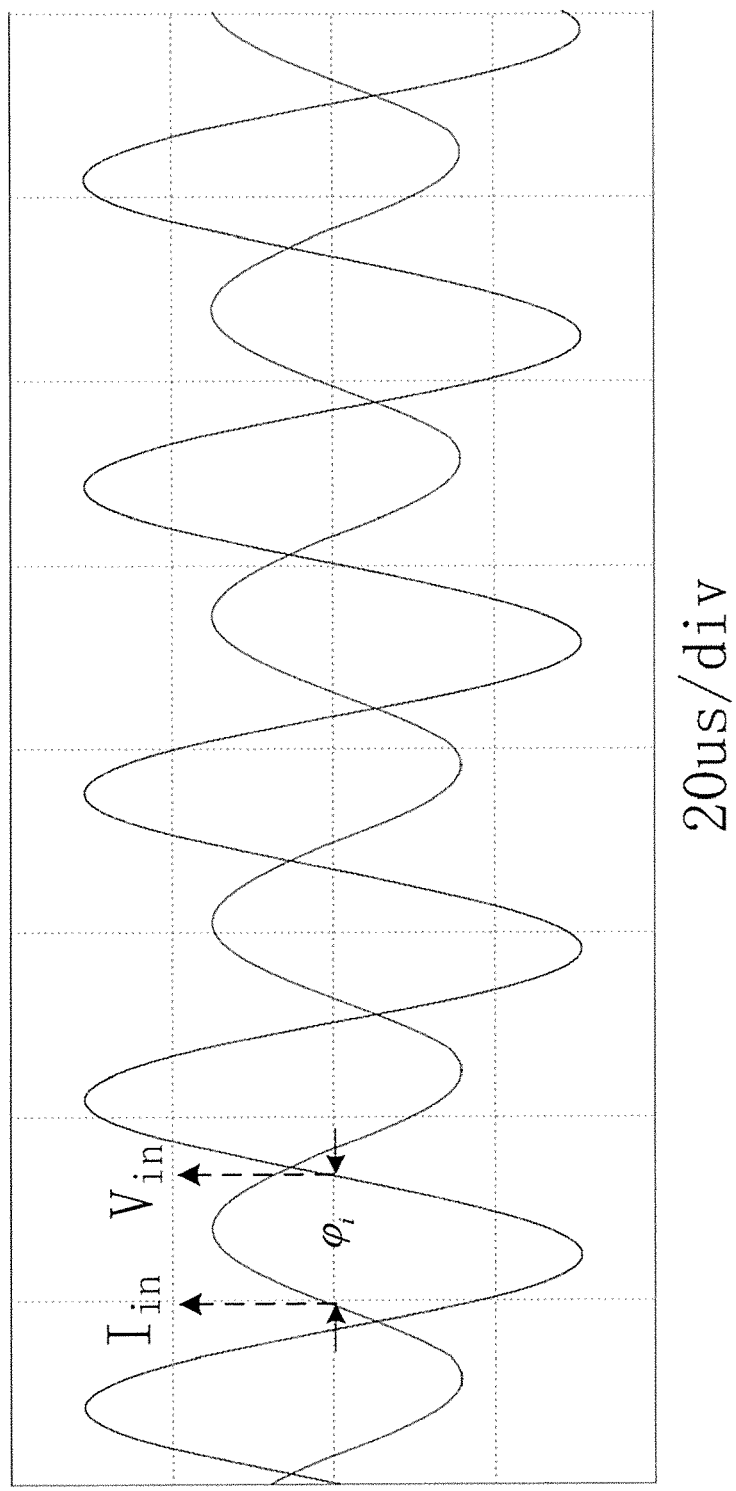
FIG. 6 is a simulation waveform diagram of an input voltage and an input current of a 1.7-order fractional-order capacitor according to an implementation.

When the simulated fractional-order capacitor satisfies $C_\alpha = 5.5 \times 10^{-11}$, $\alpha = 1.7$ and f=30 kHz, the waveforms of the input current and input voltage of the simulated model are as illustrated in FIG. 6. In this case, the phase difference between the input current and the input voltage satisfies $$\varphi_i = 1.7 \times \frac{\pi}{2},$$

and the relationship therebetween is absolutely consistent with the definition of the fraction-order capacitor.

Figure 7:
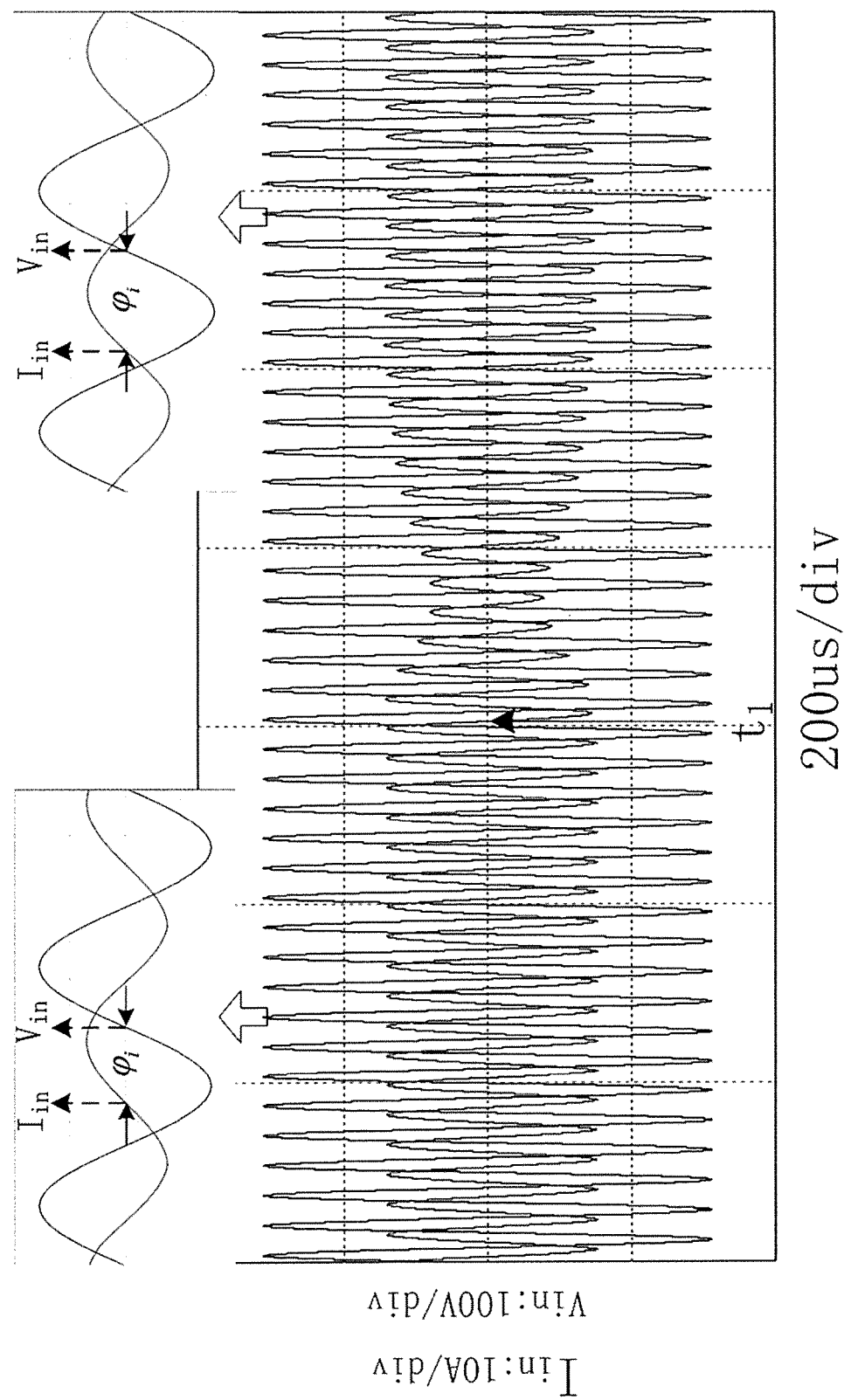
FIG. 7 is waveforms of an input current and an input voltage of a simulation model according to an implementation.

When the capacitance of the simulated fractional-order capacitor is adjusted from the capacitance of $7 \times 10^{-9}$ with an order of 1.3 to the capacitance of $5.5 \times 10^{-11}$ with an order of 1.7, the waveforms of the input current and input voltage of the simulated model are as illustrated in FIG. 7. Before the time $t_1$, the capacitance and the order of the fractional-order capacitor are $7 \times 10^{-9}$ and 1.3, respectively. In this case, the phase difference between the input current and the input voltage satisfies $$\varphi_i = 1.3 \times \frac{\pi}{2}.$$

After the time $t_1$, $C_\alpha$ and $\alpha$ in formula (7) are online modified to $C_\alpha = 5.5 \times 10^{-11}$ and $\alpha = 1.7$, respectively. 400 µs later, the capacitance of the fractional-order capacitor reaches $5.5 \times 10^{-11}$ with an order of 1.7. In this case, the phase difference between the input current and the output current satisfies $$\varphi_i = 1.7 \times \frac{\pi}{2}.$$

Therefore, the above simulation verifies feasibility and correctness of the present invention. First, an active power may be output, which satisfies the characteristics of the fractional-order capacitor with the order greater than 1. Second, a high-frequency alternating current voltage may be output, which meets the requirements of high-frequency operation of the fractional-order capacitor. Third, a control signal may be designed according to the application scenario, which controls an output voltage of the high-frequency alternating current inverter circuit, and online adjusts and achieves the fractional-order capacitors with different capacitances and orders. Fourth, the power of the fractional-order capacitor is determined by a rated power of the high-frequency alternating current inverter circuit, and the fractional-order capacitor with the order greater than 1 with different power levels may be achieved by designing operation parameters of the high-frequency alternating current inverter circuit, which provides a reference for the practical application of the fractional-order capacitor with the order greater than 1 in the future.

The embodiments described above are exemplary implementations of the present invention. However, implementations of the present invention are not limited to the above embodiments. Any variations, modifications, substitutions, combinations, or simplifications, or the like made to the present invention without departing from the spiritual essence and principle of the present invention shall all be equivalent replacements, which are covered within the scope of protection of the present invention.

What is claimed is:

1. A high-power adjustable high-frequency fractional-order capacitor with an order greater than 1, comprising:
    an alternating current input module (1);
    a coupling impedance (2);
    a high-frequency alternating current controlled voltage source (3);
    an alternating current input sampling module (4); and
    a controller (5),
    wherein an end (A) of the alternating current input module (1) is connected to an end of the coupling impedance (2), the other end of the coupling impedance (2) is connected to a positive output end (P) of the high-frequency alternating current controlled voltage source (3), a negative output end (N) of the high-frequency alternating current controlled voltage source (3) is connected to the other end (B) of the alternating current input module (1),
    wherein the alternating current sampling module (4) samples an input current and an input voltage to obtain an amplitude and a phase of the input current as well as an amplitude and a phase of the input voltage and feeds the amplitudes and phases into the controller (5), the controller (5) processes sampled signals based on a fractional-order capacitor current closed-loop control algorithm and generates a control signal to send to the high-frequency alternating current controlled voltage source (3), and the high-frequency alternating current controlled voltage source (3) generates a fundamental wave voltage between the positive output end (P) and the negative output end (N) according to the control signal.

2. The high-power adjustable high-frequency fractional-order capacitor with the order greater than 1 according to claim 1, wherein the high-frequency alternating current controlled voltage source (3) is formed of a high-frequency alternating current inverter circuit capable of outputting a high-frequency alternating current voltage, the high-frequency alternating current controlled voltage source (3) outputs an active power outward such that the order greater than 1 is achieved, and fractional-order capacitors with different power levels are achieved by using controlled voltage sources with different power capacities.

3. The high-power adjustable high-frequency fractional-order capacitor with the order greater than 1 according to claim 1, wherein the controller (5) is formed of a digital signal processor.

4. The high-power adjustable high-frequency fractional-order capacitor with the order greater than 1 according to claim 1, wherein the fractional-order capacitor current closed-loop control algorithm is a current closed-loop control algorithm based on phasor analysis.

5. The high-power adjustable high-frequency fractional-order capacitor with the order greater than 1 according to claim 1, wherein the fractional-order capacitor current closed-loop control algorithm is achieved when running on a digital signal processor, and online adjustments of a capacitance and the order of the fractional-order capacitor are achieved by online modifying a software parameter.

6. The high-power adjustable high-frequency fractional-order capacitor with the order greater than 1 according to claim 1, wherein the order is $\alpha$, whose value range is as follows:

$$\alpha>1 \text{ and } \alpha\in(4k+1, 4l+2)$$

wherein k is an integer.

7. A control method for a high-power adjustable high-frequency fractional-order capacitor with an order greater than 1 according to claim 1, wherein a fractional-order capacitor current closed-loop control algorithm is adopted as based on a "phasor analysis", and the method specifically comprises:
    assuming that an input voltage $V_{in}$, an input current $I_{in}$, and an output voltage $V_F$ of a high-frequency controlled source are all pure sinusoidal within an alternating current cycle and are co-frequency sinusoidal quantities;
    when $V_F$, $V_{in}$ and $I_{in}$ are all sinusoidal, waveforms thereof are only depicted by frequency, amplitude and initial phase, and the waveforms are represented by the phasor analysis, a complex plane is constructed by using a direction of $V_{in}$ as a real axis, and 90 degrees leading the direction of $V_{in}$ as an imaginary axis, and then phasor forms and an expression on the complex plane of $V_F$, $V_{in}$ and $I_{in}$ are as follows:

$$\dot{V}_F = V_{Fm}\angle(\varphi_F) = V_{F\_REAL} + jV_{F\_IMA}$$

$$\dot{V}_{in} = V_{inm}\angle(0) = V_{inm}$$

$$\dot{I}_{in} = I_{in}\angle(\varphi_i) = I_{in\_REAL} + jI_{in\_IMA},$$

wherein $\varphi_F$ and $\varphi_i$ are angle values of the output voltage of the controlled voltage source and the input voltage leading the input current, respectively, $V_{Fm}$ is an amplitude of the output voltage of the controlled source, respectively, $V_{F\_REAL}$ and $V_{F\_IMA}$ are a real portion and an imaginary portion of $\dot{V}_F$, respectively, and $I_{in\_REAL}$ and $I_{in\_IMA}$ are a real portion and an imaginary portion of $\dot{I}_{in}$, respectively;
    after a controller converts the input voltage of the alternating current input sampling module into a phasor expression, performing following operation:

$$\dot{I}_{ref} = (jw)^\alpha C_\alpha \dot{V}_{in} = w^\alpha C_\alpha V_{inm} j^\alpha$$
$$= w^\alpha C_\alpha V_{inm}\cos\left(\frac{\pi}{2}\alpha\right) + jw^\alpha C_\alpha V_{inm}\sin\left(\frac{\pi}{2}\alpha\right)$$
$$= I_{ref\_REAL} + jI_{ref\_IMA},$$

wherein $\dot{I}_{ref}$ is a phasor expression of a current given signal $I_{ref}(t)$ in the fractional-order capacitor current closed-loop control algorithm, $I_{ref\_REAL}$ and $I_{ref\_IMA}$ are a real portion and an imaginary portion of $\dot{I}_{ref}$, respectively, $C_\alpha$ is a capacitance of the fractional-order capacitor, $\alpha$ is the order of the fractional-order capacitor, and as seen from the above formula, a relationship between the current given signal $\dot{I}_{ref}$ and the input voltage $V_{in}$ is a current-voltage relationship of the fractional-order capacitor; and comparing the current given signal $I_{ref}$ with the input current $I_{in}$ to obtain a difference, and obtaining a voltage $V_F$ desired to be output by the high-frequency alternating current controlled voltage source from the obtained difference by the current closed-loop control algorithm, and converting the voltage into the control signal D to regulate the input current $I_{in}$, such that the input current $I_{in}$ traces the current given signal $I_{ref}$, that is, such that the relationship between the input current and the input voltage is the current-voltage relationship of the fractional-order capacitor.

\* \* \* \* \*